(12) United States Patent
Takayanagi et al.

(10) Patent No.: US 6,675,368 B2
(45) Date of Patent: Jan. 6, 2004

(54) APPARATUS FOR AND METHOD OF PREPARING PATTERN DATA OF ELECTRONIC PART

(75) Inventors: Mariko Takayanagi, Kawasaki (JP); Shunko Magoshi, Yokohama (JP); Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 101 days.

(21) Appl. No.: 09/962,454

(22) Filed: Sep. 26, 2001

(65) Prior Publication Data

US 2002/0042906 A1 Apr. 11, 2002

(30) Foreign Application Priority Data

Sep. 27, 2000 (JP) .................... P2000-295147

(51) Int. Cl.[7] .............................................. G06F 17/50
(52) U.S. Cl. ........................................... 716/21; 716/19
(58) Field of Search .................................. 716/1–21

(56) References Cited

U.S. PATENT DOCUMENTS 5,253,182 A * 10/1993 Suzuki ................... 716/21
5,364,718 A * 11/1994 Oae et al. ................ 430/5
5,590,048 A * 12/1996 Abe et al. ............... 716/19

FOREIGN PATENT DOCUMENTS

| JP | 2-71509 | 3/1990 | |
| JP | 402071509 A | * 3/1990 | ......... H01L/21/027 |
| JP | 9-293667 | 11/1997 | |
| JP | 10-223508 | 8/1998 | |
| JP | 2950275 | 7/1999 | |

* cited by examiner

*Primary Examiner*—Matthew Smith
*Assistant Examiner*—Sun James Lin
(74) *Attorney, Agent, or Firm*—Finnegan, Henderson, Farabow, Garrett & Dunner, L.L.P.

(57) ABSTRACT

A method divides a layout area of an electronic part into sections, designs patterns according to circuit data of de electronic part, and draws the patterns in the layout area section by section so that the patterns in the sections may collectively form the electronic part. The method detects, among the patterns, any violation pattern that may cause a characteristic failure in the electronic part due to a section-to section connection error. Such violation pattern has a size L smaller than a threshold "k*La" where La is a section-to-section connection allowance and k is a coefficient. Also provided is an apparatus for executing the method.

20 Claims, 16 Drawing Sheets

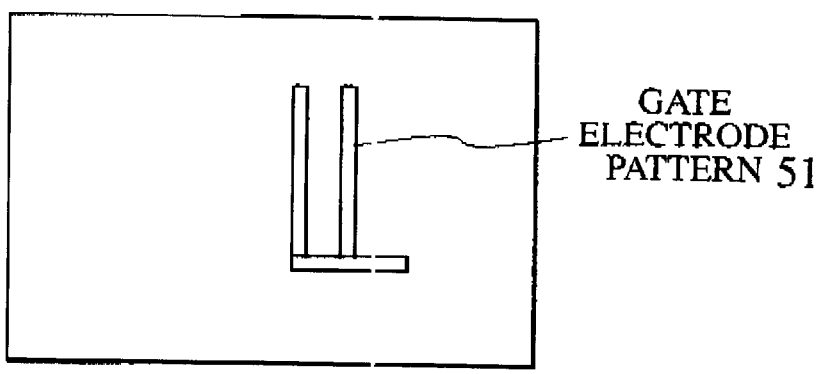
FIG.1A PRIOR ART — GATE ELECTRODE PATTERN 51
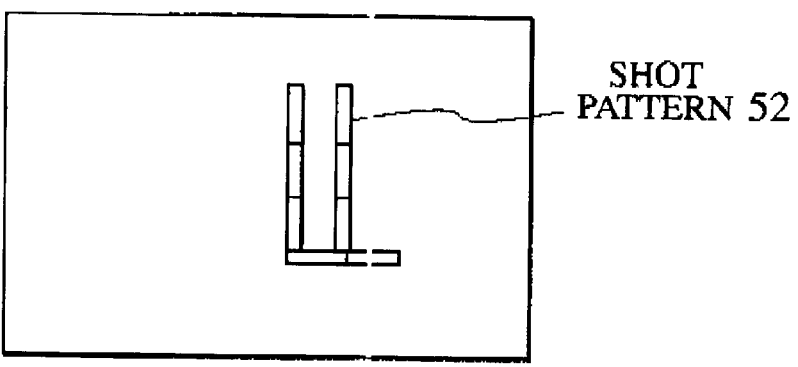
FIG.1B PRIOR ART — SHOT PATTERN 52
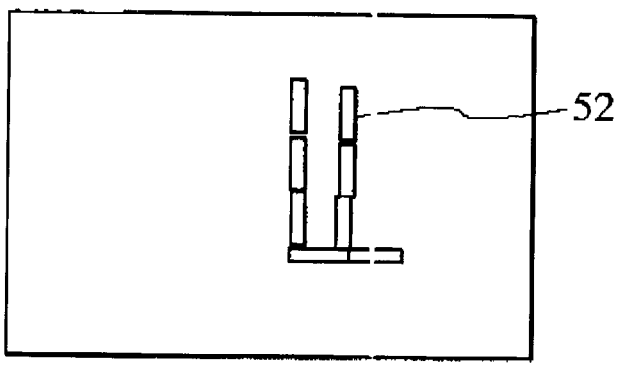
FIG.1C PRIOR ART — 52
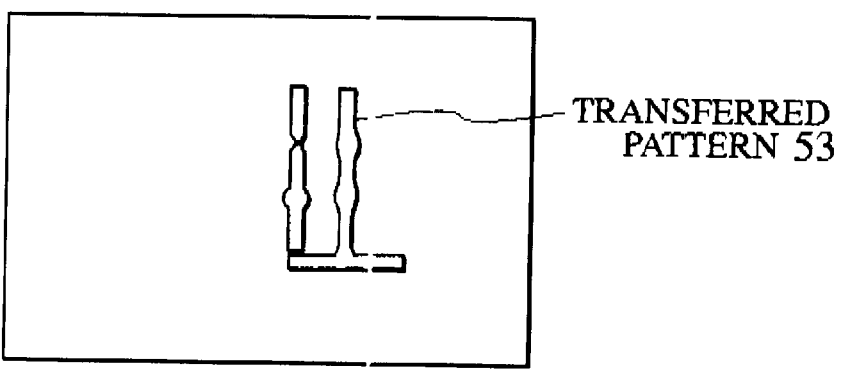
FIG.1D PRIOR ART — TRANSFERRED PATTERN 53

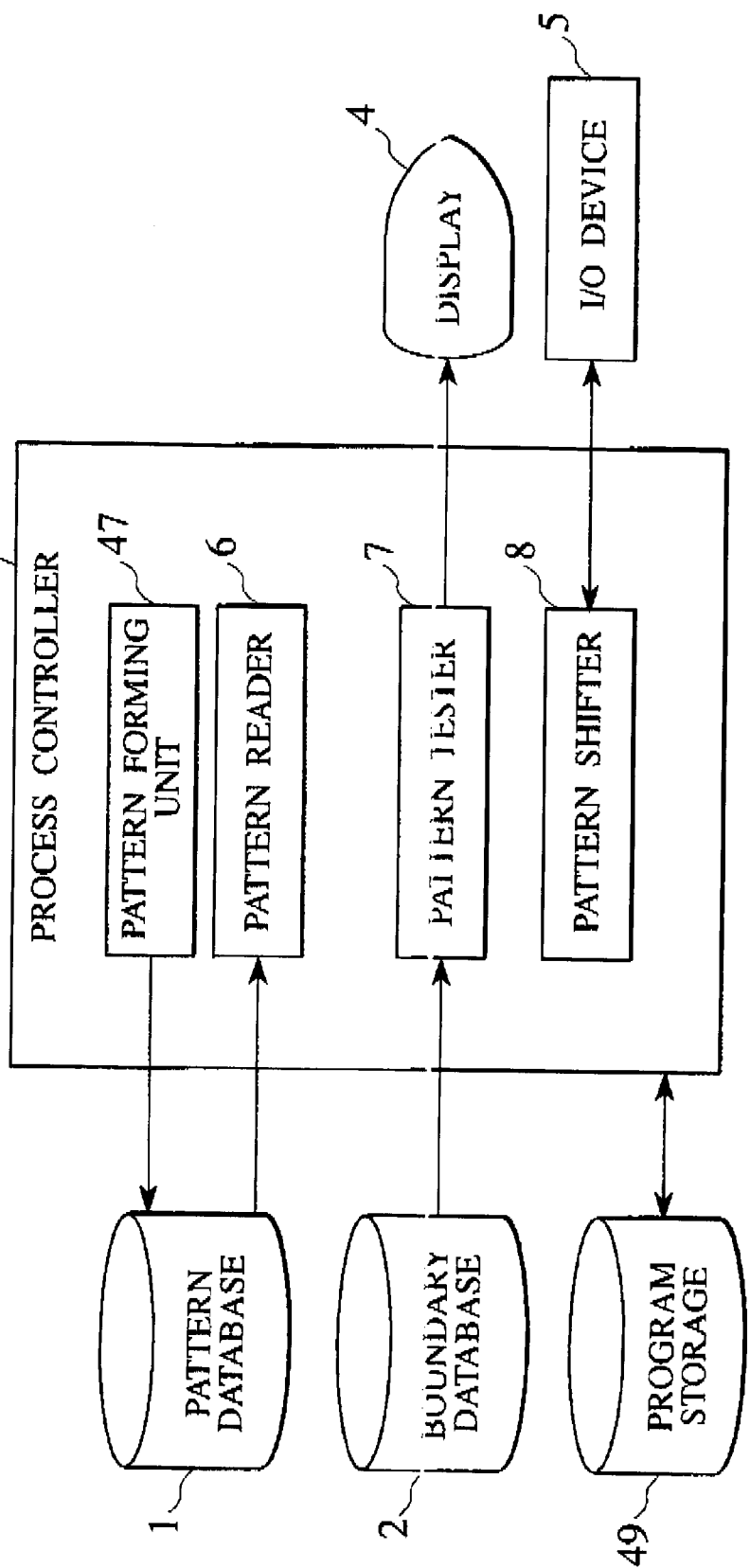

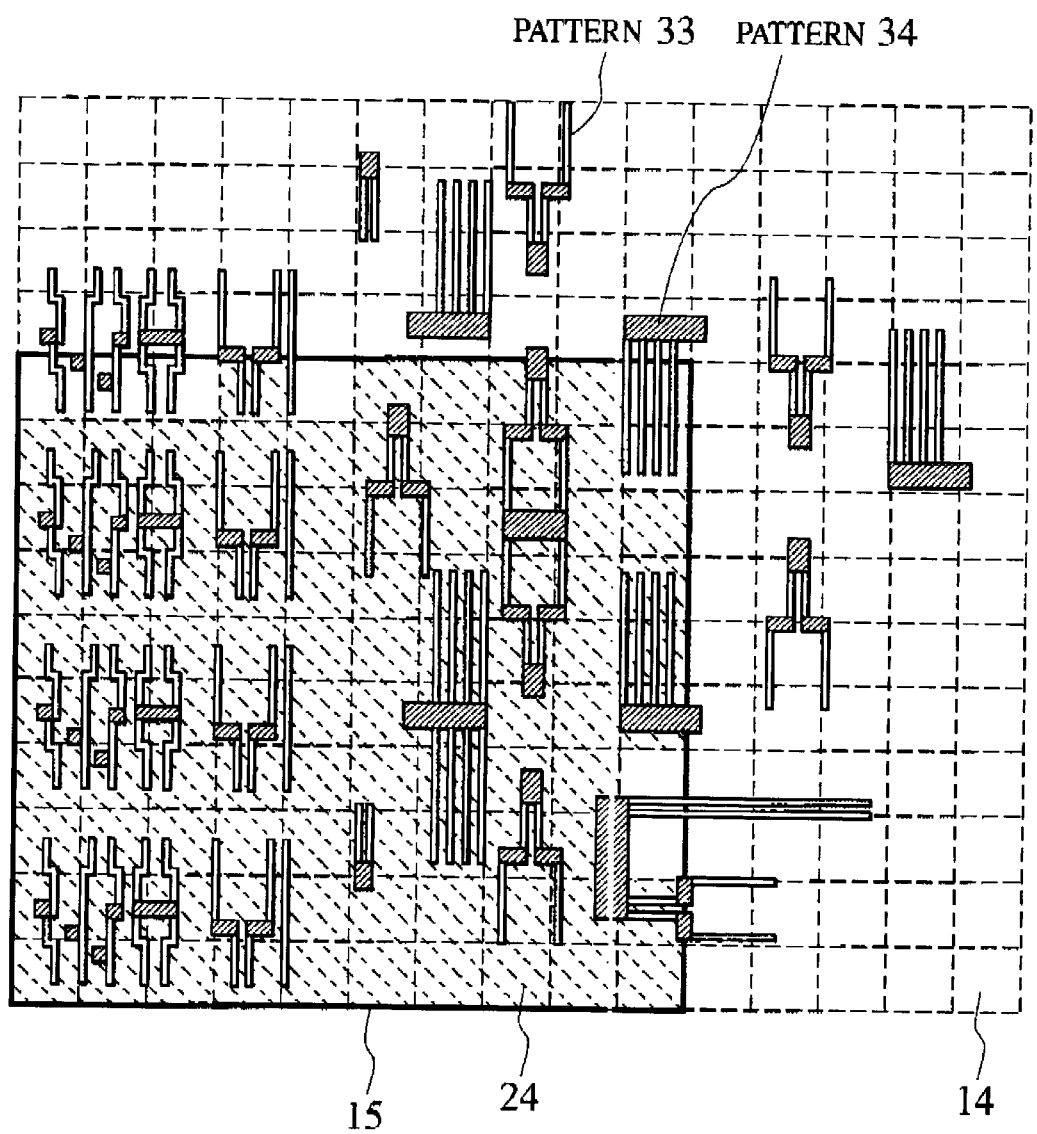

LEVEL-i SECTION 15
41
BOUNDARY OF LEVEL-(i+1) SECTION 41

42
37

37
43
CONNECTION PATTERN 44

APPARATUS FOR AND METHOD OF PREPARING PATTERN DATA OF ELECTRONIC PART

CROSS REFERENCE TO RELATED APPLICATIONS

This application claims benefit of priority under 35 USC 119 to Japanese Patent Application No. P2000-295147 filed Sep. 27, 2000, the entire contents of which are incorporated by reference herein.

BACKGROUND OF THE INVENTION

1. Field of the Invention

The present invention relates to a pattern writing system, algorithm of pattern data generation and method of writing a pattern layout of electronic parts. The present invention consists of an apparatus for and a method of dividing a layout area, which generally corresponds to a writing field of the pattern writing system, into small sections (fields) and dividing a pattern layout of an electronic part into small figures (shots). The pattern layout of the electronic part is formed by drawing pattern data in each section by section-by-section exposure. The present invention also relates to a storage medium storing a computer program to execute the method mentioned above with a computer system. In particular, the present invention relates to a pattern writing system like electron beam (EB) exposure system for writing patterns of a semiconductor integrated circuit, which has high-density of fine patterns. The pattern layout of the electronic device is realized by dividing the pattern layout into small figures and by dividing exposure region into small sections, and small figures within of each section is exposed section-by-section so that small figures may collectively constitute the pattern layout. The present invention also relates to any pattern writing method and algorithm of pattern data generation, which divides the pattern layout of the electronic part into small figures and divides the writing field of the pattern writing system, which can be used to write patterns of printed circuit boards or any other patterns.

2. Description of the Related Art

The minimum feature size of semiconductor is decreasing year by year according to the scaling law and fabrication of fine patterns below 100 nm is strongly required at present. Such fine patterns are out of the resolution of optical exposure systems, and electron beam exposure systems of high resolution are expected to cope with such fine patterns.

In electron beam exposure system, pattern layout of LSI is divided into small figures where one figure correspond to one beam shot of the electron beam. The size of each shot is typically of several microns, which is being determined to secure uniform electron beam intensity. The electron beam exposure system emits and electron beam to a substrate section by section, to draw continuous patterns on the substrate. Any LSI pattern or wiring pattern extending over several sections is divided into several shots and is formed on the substrate section by-section such that shot within of one section is exposed and then shots in adjacent section is exposed.

FIG. 1A shows a gate electrode pattern 51 of MOSFET as an example of a pattern formed in a layout area of an electronic part. The pattern 51 is divided into shots 52 as shown in FIG. 1B. The shots 52 in FIG. 1B are still in the form of pattern data (design data), and therefore, involve no connection errors.

Whether or not the pattern 51 is correctly drawn on a substrate by electron beam exposure is dependent on the positioning accuracy of the shots 52. If the positioning accuracy is low, the shots 52 may partly overlap or may be discontinuous.

FIG. 1C shows misalignment among the shots 52 due to positioning errors of the electron beam. These positioning errors draws a deformed gate electron 53 of FIG. 1D on a substrate after shot-by-shot electron beam exposure. If adjacent shots overlap each other, the drawn gate electrode 53 will be long at a connection between the shots. If adjacent shots are separated from each other, the drawn gate electrode 53 will be short at a connection between the shots. The long connection decreases the driving power of the MOSFET, and the shot connection increases OFF leak current. If the connection is too short and breaks, an OFF leak current increase and a driving power decrease simultaneously occur to deteriorate the performance and yield of the MOSFET.

FIG. 2 is a graph showing drain current-gate voltage (Id-Vg) curves of MOSFETs Id-Vg characteristics of a normal MOSFET without a gate electrode depicted with the curve with circles shows a steep change in drain current around a gate voltage of zero. Id-Vg characteristics of a defective MOSFET with a broken gate electrode depicted with curve with triangles shows an almost constant drain current irrespective of gate voltage. This defective MOSFET shows increase in OFF leakage current which deteriorate switching performance of MOSFET.

The most effective way to prevent the deformation of formed pattern is to improve the positioning accuracy of each beam shot. However, there is a limit in improving the beam positioning accuracy, which is mainly an issue of mechanical control of the stage and electrostatic control of the electron beam. Therefore, another approach such as pattern generation algorithm should be considered. For example, Japanese Unexamined Patent Publication Nos. 10-223508 and 9-293667 disclose techniques of setting connections of shots in isolation region when forming gate electrode patterns of MOSFETs. The main idea of these patents is to generate shot patterns of to-be-drawn gate electrode patterns to be butt-joined to each other on the isolation region. This is because deformation of gate electrode pattern on the isolation field is less sensitive to MOSFET characteristics compared to deformation of gate electrode pattern on active area.

The techniques may be easy to achieve and effective when applied to LSIs having regular patterns of fixed size such as memories. The techniques, however, are ineffective when applied to logic or analog LSIs having random patterns with different shape and size that hardly allow shot connections to be formed in element isolation regions.

Japanese Unexamined Patent Publication 2-71509 discloses a technique of providing shots with protrusions at the butting edge. The protrusions of shots sections overlap at exposure, to avoid shot-by-shot breakage or thickening. This technique needs a beam shot having the special shape that requires a special aperture or stencil mask, and therefore, is impractical for producing logic or analog LSIs consist of different patterns.

BRIEF SUMMARY OF THE INVENTION

The object of the invention is to provide a pattern forming method and pattern forming apparatus in order to realize high writing accuracy, which divides writing field into small sections and write pattern data section-by-section, where the relationship between the pattern layout and the boundary of sections is considered in writing sequence.

A first aspect of the present invention provides an apparatus which prepares EB-data, comprising the step of dividing a writing field into small sections and generating a to-be-drawn pattern layout of an electronic part into small figure (shots), in order to form a desired pattern layout by exposing shots within of one section and repeating section-be-section exposure. Hereafter, we define EB-data as a general name for the data used to control the pattern writing equipment, such as pattern data (shot data) of the layout and data of sections. The apparatus includes an EB-data generator and an EB-data diagnosis unit. The EB-data generator divides the layout area (writing field) into small sections and divides the pattern layout of a circuit of an electronic part into small figures where a small figure corresponds to a single shot of the beam. The EB-data diagnosis unit detects a violation shot among the shot data that crosses a boundary between adjacent ones of the sections and has shot size L smaller than a threshold "k*La" where La is a section-to-section connection allowance and k is a coefficient.

A second aspect of the present invention provides a method of preparing EB-data, comprising the step of dividing a writing field into small sections and generating a to-be-drawn pattern layout of an electronic part into small figures (shots), in order to form a desired pattern layout be exposing shots within of one section be repeating section-by-section exposure The method forms and lays the patterns in the layout area according to circuit data of the electronic part, the layout area being divided into the sections. The method detects a violation shot among the shot data that crosses a boundary between adjacent ones of the sections and has shot size L smaller than a threshold "k*La" where La is a section-to-section connection allowance and k is a coefficient.

A third aspect of the present invention provides a computer program for preparing EB-data used for a process that divides a layout area of an electronic part into sections and draws patterns in the layout area section by section. The computer program executes a series of procedures to form pattern data in a layout area of an electronic part according to circuit data of the electronic part, the layout area being divided into sections, and detect a violation shot among the shot data that crosses a boundary between adjacent ones of the sections and has a shot size L smaller than a threshold "k*La" where La is a section-to-section connection allowance and k is a coefficient.

A fourth aspect of the present invention provides a method of preparing EB-data, comprising:

the step of dividing a layout area of an electronic part into hierarchical sections having different predefined area ranging from level-0 to level-N, where level-0 sections are unit sections having the smallest area and level-N sections are sections having the largest area, and hereafter, level-i sections (i being sequentially changed from 1 to N) is defined as the sections having the area size of i-th size counted up from the sections having the smallest area, the step of generating pattern data (shot data) from the to-be-drawn layout pattern of circuit data, the step of grouping level-(i-1) sections to groups which satisfy the shot data that crosses a boundary between adjacent ones of the sections has a shot size L smaller than a threshold "k*La,i" where La,i is a section-to-section connection allowance of level-i sections and k is a coefficient, the step of forming new groups having area size below predefined area size of level-i section, which consist of level-(i-1) section groups (determined in the above step) that adjoin to each other, and redefine the new groups as level-i sections, thereby, a desired layout pattern of the electronic part is formed by exposing the shot within of one section, section-by-section.

A fifth aspect of the present invention provides an electronic part having a layout area divided into sections. The layout area has patterns drawn section, every pattern that crosses a boundary between adjacent sections having a size L greater than a threshold "k*La" where La is a section-to-section connection allowance and k is a coefficient.

A sixth aspect of the present invention provides a method of manufacturing an electronic part including designing and laying patterns in a layout area of the electronic part, dividing the layout area into sections, detecting among the patterns, a violation pattern that crosses a boundary between adjacent ones of the sections and has a size L smaller than a threshold "k*La" where La is a section-to-section connection allowance and k is a coefficient, shifting the violation pattern into one of the adjacent sections, and drawing the patterns including a shifted violation patterns, in the layout area by section-by-section exposure.

BRIEF DESCRIPTION OF THE DRAWINGS

FIG. 1A shows a gate electrode pattern as an example of a pattern formed in a layout area of a MOSFET;

FIG. 1B shows pattern data (shot data) divided from the gate electrode pattern of FIG. 1A;

FIG. 1C shows connection errors in the pattern data (shot data) of FIG. 1B;

FIG. 1D shows a gate electrode pattern formed by electron beam exposure involving the connection errors of FIG. 1C;

FIG. 6 is a block diagram showing an EB-data preparing apparatus according to a first embodiment of the present invention;

FIG. 14 shows patterns in level-i sections defined according to the method of FIGS. 13A and 13B;

DETAILED DESCRIPTION OF THE INVENTION

Figure 2:
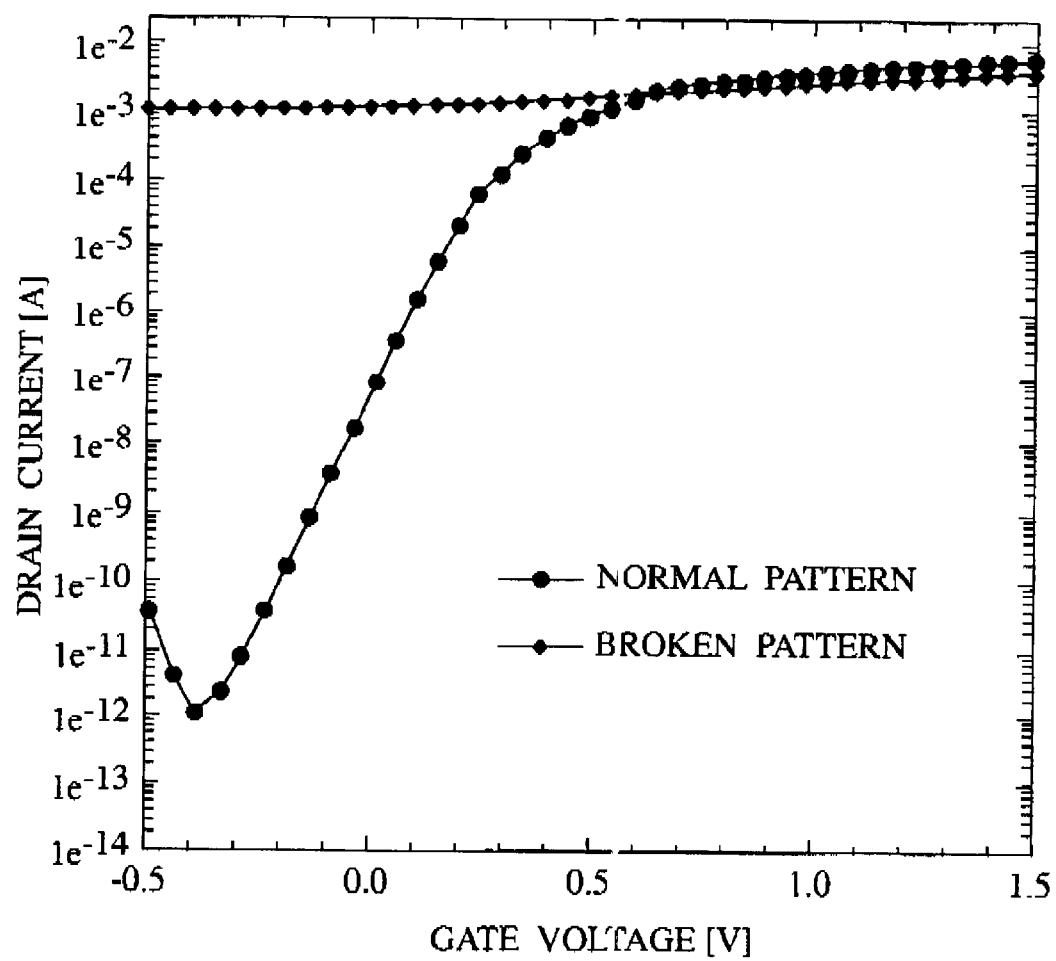
FIG. 2 is a graph showing gate voltage-drain current curves of MOSFETs.

Various embodiments of the present invention will be described with reference to the accompanying drawings. It is to be noted that the same or similar reference numerals are applied to the same or similar parts and elements throughout the drawings and the description of the same or similar parts and elements will be omitted or simplified.

(Section-by-section exposure)

Before explaining the embodiments of the present invention, an explanation will be made on a layout area of a logic LSI involving patterns that are randomly arranged and have different shapes to which the embodiments of the present invention is applicable. Also, positioning and exposing method of an electron beam exposure system will be explained.

Figure 3:
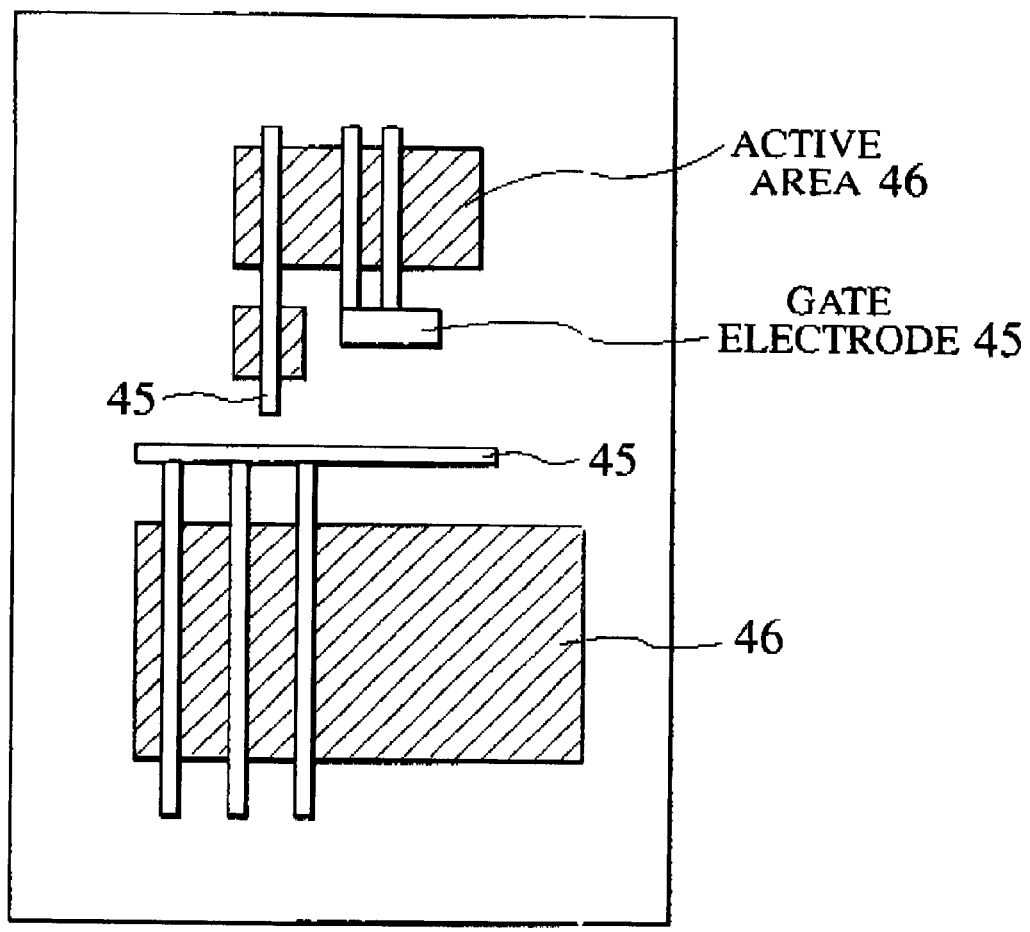
FIG. 3 shows an example of a layout area in a logic LSI involving randomly arranged patterns of different shapes to which an EB-data preparing method according to embodiments of present invention is applied.

FIG. 3 roughly shows an example of a layout area in a logic LSI involving randomly arranged patterns of different shapes to which a pattern data preparing method according to embodiments of present invention is applied. The layout area contains gate electrodes 45 and active area 46 such as source/drain regions of MOSFETs of the LSI. The electrodes 45 and active area 46 are randomly arranged and have different shapes. Each gate electrode 45 is wider than the maximum width of one shot of an electron beam, and therefore is divided into a plurality of beam shots and exposed shots by shots. Similarly, each active area 46 is divided into beam shots.

Figure 4A:
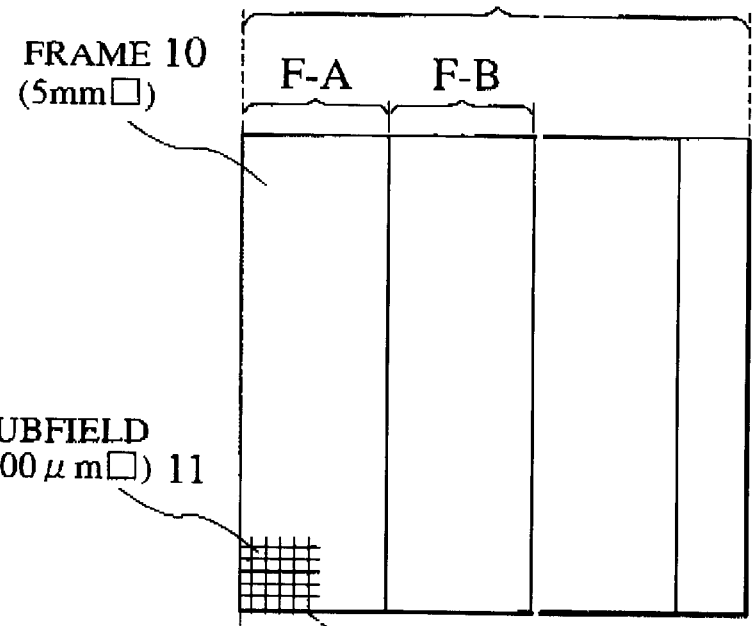
FIG. 4A shows a layout area of an LSI divided into frames according to embodiments of the present invention.

An electron beam exposure system positions a shot of electron beam through the movement of a stage on which a wafer to be exposed with the electron beam is set, and by three deflectors for deflecting the electron beam. The regions where each deflector controls correspond to sections. The deflectors include a main deflector, a subdeflector, and a sub-subdeflector. FIG. 4A shows a layout area 9 of an electronic part such as a semiconductor chip where patterns are formed. The area 9 is divided into frames 10 in the moving direction of the stage. Each frame 10 is a strip of 5 mm wide and its largest section divided from the area 9, which corresponds to level-3 section in this case. Each frame 10 is positioned by moving the stage. Each frame 10 is divided into subfields 11.

Figure 4B:
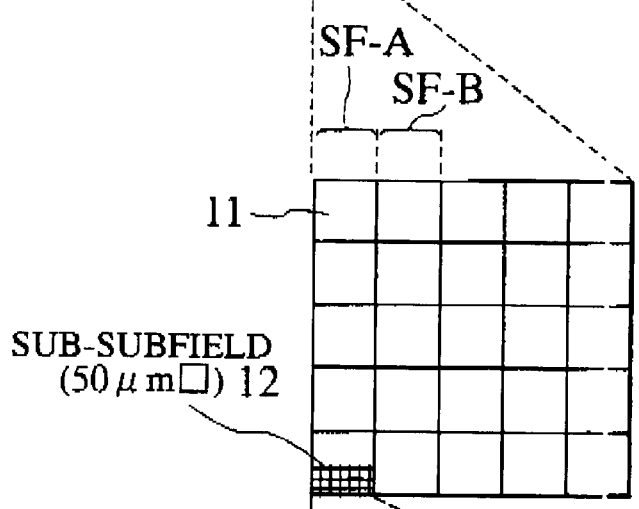
FIG. 4B shows a part of the frame of FIG. 4A divided into subfields.

FIG. 4B shows the subfields 11 each being a square having a side length of 500 $\mu$m as a predefined side length. In a given flame 10, each subfield 11 is positioned by the main deflector. Each subfield 11 correspond to level-2 section in this case. Each subfield 11 is divided into sub-subfields 12.

Figure 4C:
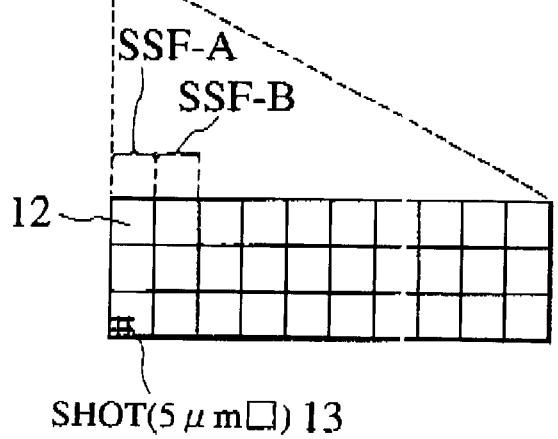
FIG. 4C shows a part of the subfield of FIG. 4B divided into sub-subfields each of which contains shot data.

FIG. 4C shows the sub-subfields 12 each being a square having a side length of 50 $\mu$m as a predefined side length. In a given subfield 11, each sub-subfield 12 is positioned by the subdeflector. Each subfield 12 is divided into unit sections 13 which is level-0 sections for the electron beam exposure.

Each unit sections 13 is a square having maximum side length of 5 $\mu$m. In a given sub-subfield 12, the each unit section 13 is positioned by the sub-subdeflector.

In this way, an electron beam unit section 13 is positioned through a combination of the stage, main deflector, subdeflector, and sub-subdeflector working on the sections 10, 11, 12, and 13, respectively. The stage and deflectors have different positioning allowances. These allowances cause connection errors when forming patterns by section-by-section exposure. The connection errors occur along the boundaries of the sections.

The sub-subdeflector has an average positioning allowance of about 5 nm. Accordingly, a pattern crossing a boundary between adjacent unit sections 13 involves a connection error of 5 nm in average at the boundary.

In FIG. 4C, a pattern a boundary between sub-subfields SSF-A and SSF-B is divided into these sub-subfields and into corresponding unit sections 13. A sum of the connection allowances of the sub-subdeflector and subdeflector is 10 nm in average. Accordingly, the pattern which exist on the boundary between the sub-subfields SSF-A and SSF-B involves a connection error of 10 nm in average at the boundary between the sub-subfields SSF-A and SSF-B.

In FIG. 4B, a pattern crossing a boundary between subfields SF-A and SF-B is divided into these sub-fields, into corresponding sub-subfields 12, and into corresponding unit sections 13. A sum of the connection allowances of the sub-subdeflector, subdeflector, and main deflector is 30 nm in average. Accordingly, the pattern which exist on the boundary of subfields SF-A and SF-B involves a connection error of 30 nm in average at the boundary between subfields SF-A and SF-B.

In FIG. 4A, pattern crossing a boundary between frames F-A and F-B is divided into these frames, into corresponding subfields 11, into corresponding sub-subfields 12, and into unit sections 13. A sum of the connection allowances of the sub-subdeflector, subdeflector, main deflector, and stage is 60 nm in average. Accordingly, the pattern which exist on the boundary of frames F-A and F-B involves a connection error of 60 nm in average at the boundary between the frames F-A and F-B.

For the purpose of examining abnormalities in device pattern formed by the conventional writing method without adopting this invention, gate patterns of MOSFETs of a logic LSI having MOSFETs were actually produced by dividing the layout area of MOSFET into the sections 10 to 13 of FIGS. 4A to 4C. MOSFET has a minimum gate length of 150 nm. Th logic LSI showed a yield of less than 30%. More than 80% of MOSFETs having gate patterns crossing the boundaries of the frames 10 showed abnormalities. More than 30% of MOSFETs having gate patterns crossing the boundaries of the subfields 11 showed abnormalities.

Figure 5A:
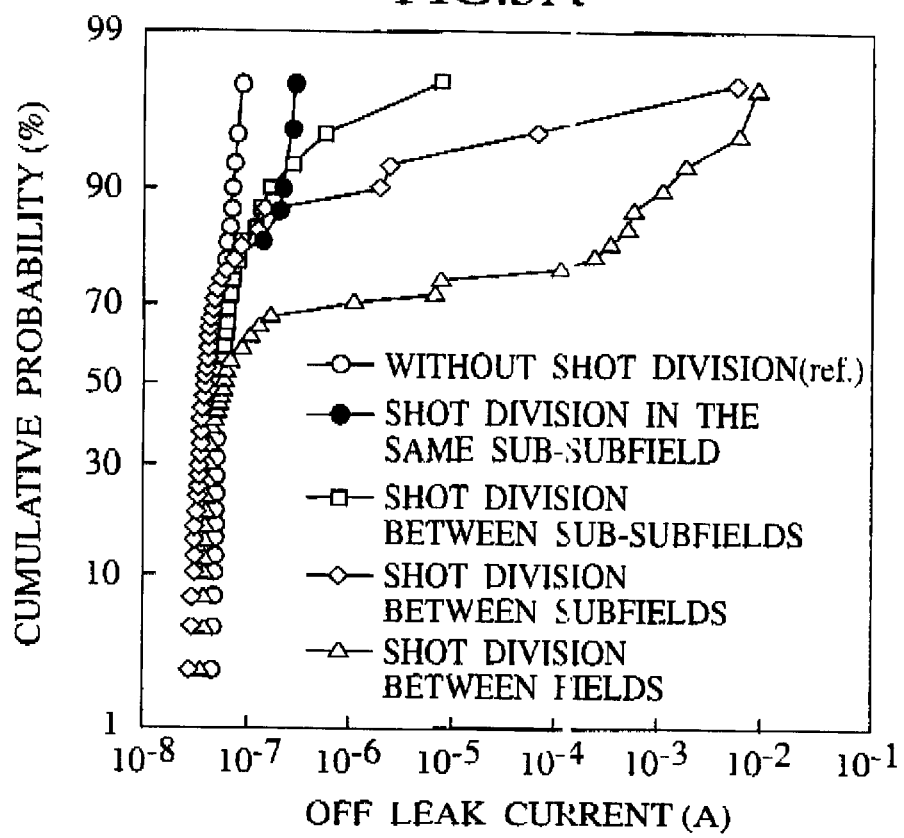
FIG. 5A is a graph showing cumulative probability of OFF leakage current of MOSFETs having different gate electrode patterns.

FIG. 5A is a graph showing cumulative probability of OFF leakage current of the tested MOSFETs. A curve of white circles represents MOSFETs each formed in a single unit section 13 without division. A curve of black circles represents MOSFETs each divided into a plurality of unit sections 13 within a single sub-subfield 12. A curve of white squares represents MOSFETs each divided into a plurality of sub-subfields and unit sections 13. A curve of rhombuses represents MOSFETs each divided into subfields 11, sub-subfields 12, and unit sections 13. A curve of triangles represents MOSFETs each divided into frames 10, sub-fields 11, sub-subfields 12, and unit sections 13.

In FIG. 5A, the number of MOSFETs having large OFF leakage currents increases as the size of sections over which the MOSFETs extend increases. Namely, the electric characteristics of a MOSFET deteriorate as connection errors at the boundaries of sections (10, 11, 12, 13) increase.

Figure 5B:
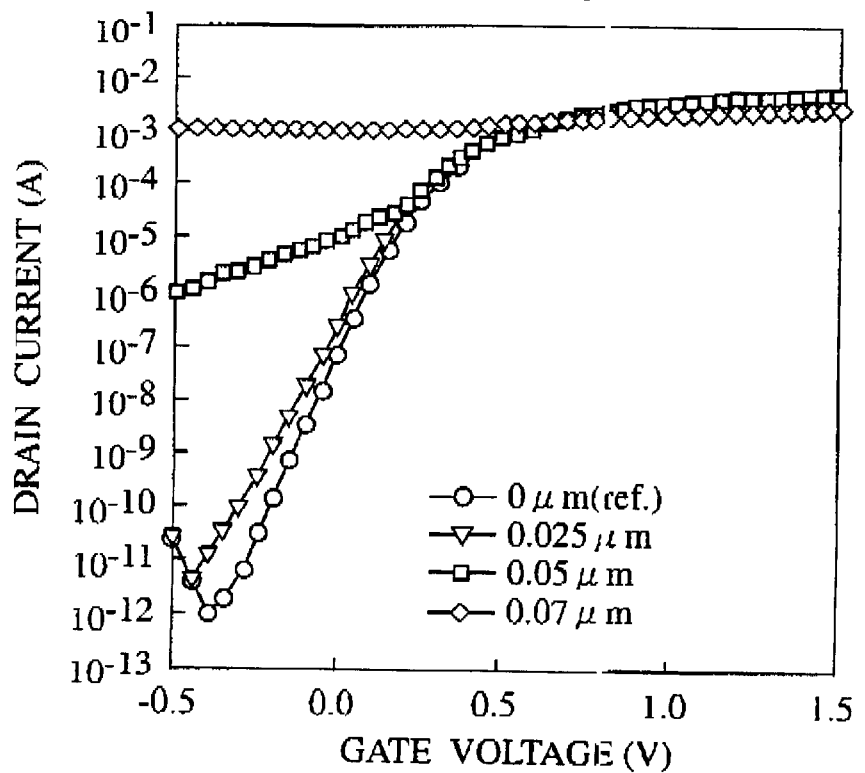
FIG. 5B is a graph showing drain current-gate voltage curves of MOSFETs having different connection errors of 0 nm, 25 nm, 50 nm, and 75 nm.

FIG. 5B is a graph showing drain current-gate voltage curves of MOSFETs having different connection errors. The MOSFETs have a gate length of 150 nm. Gate electrodes of the MOSFETs were differently divided into sections when formed, to provide them with different connection errors of 0 nm, 25 nm, 50 nm, and 75 nm. The MOSFET with a connection error of 0 nm has a gate electrode pattern formed in a single unit section.

In FIG. 5B, the MOSFET having no connection error represented with a curve of circles shows a steep change in drain current at a gate voltage of about zero. As the connection errors increase, drain current becomes constant irrespective of gate voltage. Namely, as the connection errors increase, OFF leakage current increases to deteriorate switching performance. As shown in FIGS 5A and 5B, A MOSFET whose section-to-section connection error is about 30% of a gate length has a defect probability of nearly 80%. A MOSFET whose section-to-section connection error is 25% of a gate length has a defect probability of about 10%. Any MOSFET whose section-to-section connection error is less than 25% of gate length has a defect probability of nearly 0%.

(First Embodiment)

An apparatus for preparing EB-date for an electronic part or a semiconductor ship according to the first embodiment of the present invention will be explained. The prepared EB-data is used for an exposure process that divides a layout area of the electronic part into sections and forms patterns in the layout area by section-by-section exposure. FIG. 6 roughly shows the apparatus according to the first embodiment. The apparatus includes a pattern database 1, a boundary database 2, a process controller 3, a display 4 to designate the violation pattern, an I/O device 5, and program storage 49. The process controller 3 includes a pattern generator 47, a pattern reader 6, a data diagnosis unit 7, and a pattern shifter 8.

The pattern database 1 stores pattern data including a layout of patterns prepared by the pattern generator 47. Pattern data is written into and read from the pattern database 1 in response to instructions from the process controller 3. The boundary database 2 stores data related to divided sections, such as the positioning allowances of the sections at the time of electron beam exposure, the boundary locations of the sections, the connection allowances of the sections, etc. Boundary data is written into and read from the boundary database 2 in response to instructions from the process controller 3.

The pattern generator 47 forms patterns in a layout area of a given electronic part according to circuit data of the electronic part. The pattern generator 47 may be a standard layout tool such as an automatic layout/wiring tool. The pattern reader 6 reads necessary pattern data from the pattern database 1 into the process controller 3.

The pattern diagnosis unit 7 detects, among patterns, a violation pattern having a size L smaller than a threshold "k*La", where La is a section-to-section connection allowance and k is a coefficient. Patterns to be tested and a layout thereof in a layout area of an electronic part are read out of the pattern database 1. Data related to the boundaries of sections defined in the layout area is read out of the boundary database 2, and is used for testing the patterns.

Any violation pattern having a size L smaller than the threshold "k*La" is a fine pattern, that may cause a function failure of LSI due to a connection error at a boundary between sections, where the pattern is formed. The connection error corresponds to the connection allowance La. A given two-dimensional pattern of an electronic part has at least vertical and horizontal dimensions, and therefore, it is necessary to determine one of the dimensions the size L of the pattern represents. This determination is made, by observing whether or not a given dimension of the pattern is affected by a connection error at a boundary between sections where the pattern is formed, and by observing whether or not the affected dimension deteriorates the characteristics of the electronic part. Accordingly, the size L of a pattern is dependent on the type of an electronic part in which the pattern is formed, etc., and therefore, may be determined by an operation. In the examples of FIGS. 5A and 5B, the fate width of a gate electrode pattern in a MOSFET is the size L of the gate electrode pattern.

The pattern shifter 8 shifts a violation pattern into one section. When the pattern diagnosis unit 7 detects a violation pattern, the pattern shifter 8 shifts the violation pattern so that it may not cross a section boundary.

The display 4 displays violation patterns detected by the pattern diagnosis unit 7 and section boundaries crossed by the violation patterns. The I/O device 5 is a terminal used by an operator when the operator, instead of the pattern shifter 8, shifts a violation pattern so that the violation pattern may not cross a section boundary. The I/O device 5 may be a keyboard, mouse, light-pen, printer, floppy disk drive, or any other else.

The process controller 3, pattern database 1, boundary database 2, and program storage 49 may be constituted in a standard computer system. The computer system may include a CPU and storage device connected to the CPU, the storage device including ROMs. RAMs, magnetic disks etc.

Figure 7:
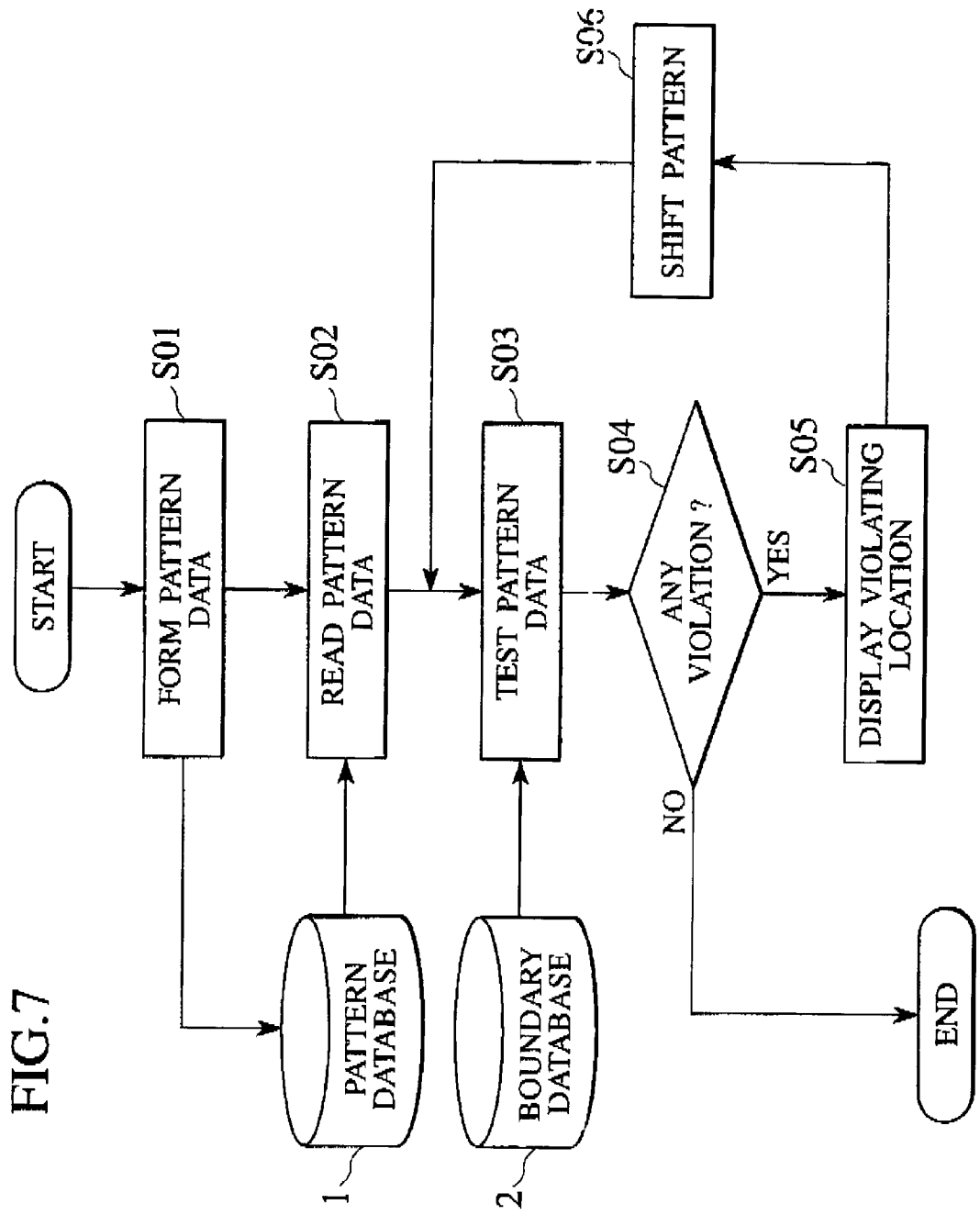
FIG. 7 is a flowchart showing an EB-data preparing method according to the first embodiment of the present invention executed by the apparatus of FIG. 6.

FIG. 7 is a flowchart showing a method of preparing EB-data according to an embodiment of the present invention, the method being executed by the apparatus of FIG. 6.

(1) In step S01, the pattern generator 47 designs pattern layout in a layout area of an electronic part, accordingly to circuit data of the electronic part, and stores the pattern layout as pattern data in the pattern database 1.

(2) In step S02, the pattern reader 6 reads the pattern data from the pattern database 1 into the process controller 3.

(3) In step S03, the pattern diagnosis unit 7 reads connection allowances and boundaries related to sections defined in the layout area. The pattern diagnosis unit 7 tests the patterns of the electronic part. Namely, the pattern diagnosis unit 7 detects, among the patterns, any violation pattern that crosses a boundary between adjacent ones of the sections, and has a size L smaller than a threshold Lth=k*La, where La is a section-to-section connection allowance and k is a coefficient. The size L of any pattern must be larger than size Lmin, where Lmin is the minimum size of an electron beam exposure system can expose. According to the first embodiment, the coefficient k is 5. A violation pattern is expressed as follows:

$$Lmin < L <= Lth$$

where Lth=k*La, k=5, and La is a section-to-section connection allowance.

(4) Step S04 determines whether or not the pattern layout include any violation pattern. If there is a violation pattern ("YES" in step S04), step S05 is carried out, and if there is no violation pattern ("NO" in step S04), the pattern data preparation ends.

(5) Step S05 displays detected violation patterns and section boundaries crossed by the violation patterns on the display 4. This enables an operator to see the violation patterns and related boundaries and speedily correct them.

(6) In step S06, the pattern shifter 8 shifts the violation patterns out of the boundaries. Instead of the pattern shifter 8, an operator may manually shift the violation patterns through the I/O device 5 while observing the violation patterns on the display 4

(7) Thereafter, step S03 is repeated. Namely, steps S03 to S06 are repeated until no violation pattern is detected.

According to the present invention, a layout area of an electronic part is divided into hierarchical sections having different predefined area ranging from level-0 to Level-N, where level-0 sections corresponding to unit sections 13 of FIG. 4C having the smallest area and level-N sections are sections having the largest area. In FIGS. 4A to 4C, a layout area of an electronic part is divided into sections 10, 11, 12, and 13 in which the unit sections 13 are level-0 sections, the sub-subfields 12 are level-1 sections, the subfields 11 are level-2 sections, and the frames 10 are level-3 sections.

Figure 8A:
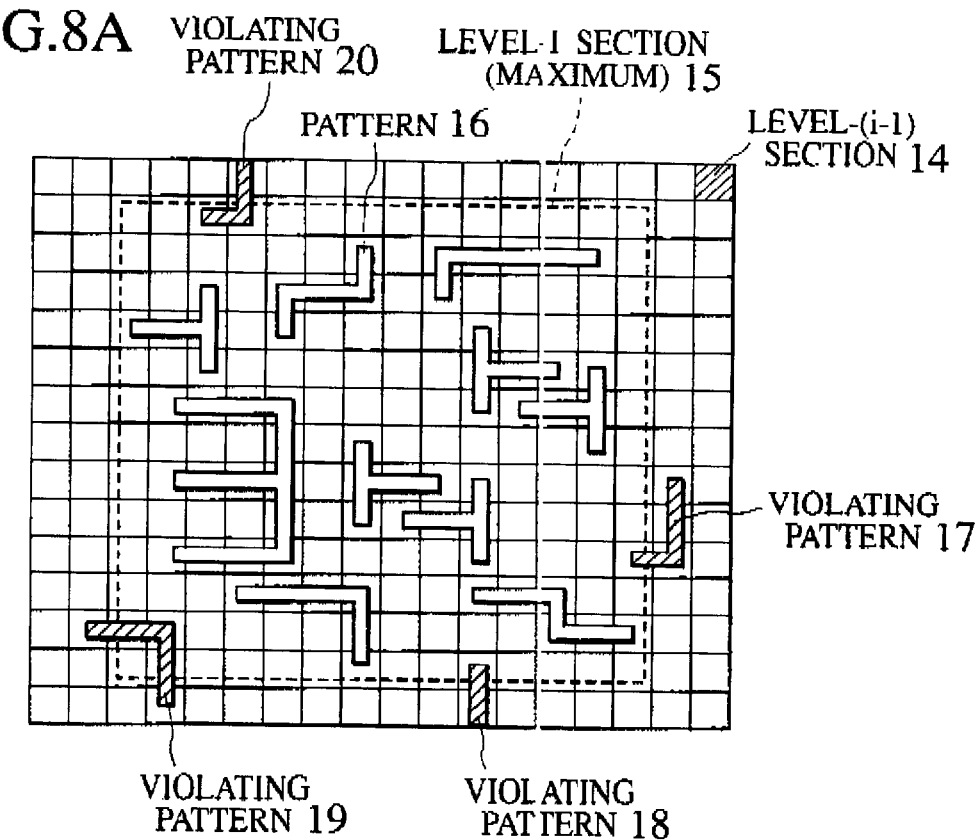
FIGS. 8A and 8B partly show a layout area of an electronic part before and after correcting violation patterns according to the method of FIG. 7.
Figure 8B:
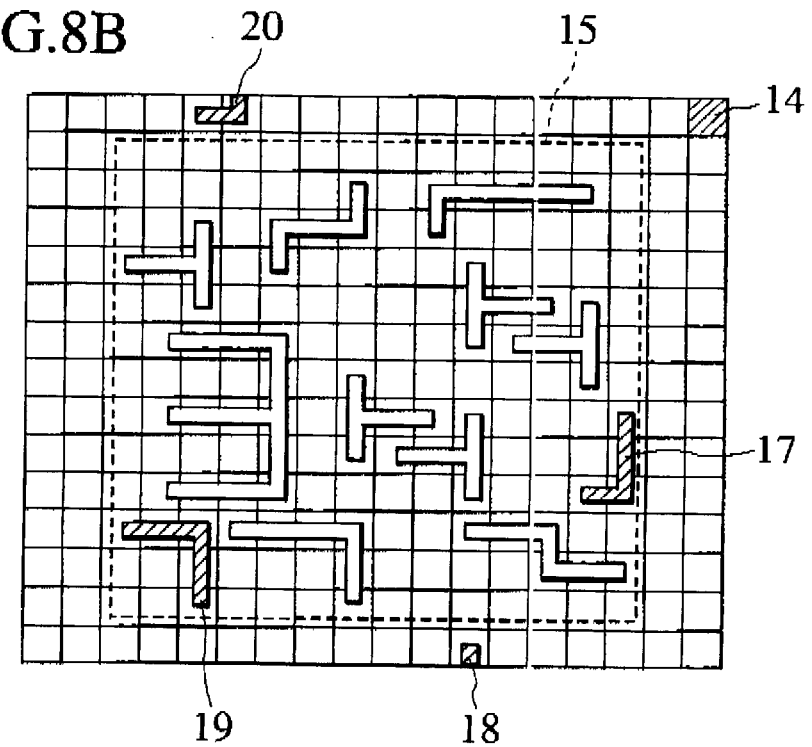

FIG. 8A shows a maximum level-i section 15 defined in a layout area of an electronic part. Each level-i section 15 is divided into a matrix of level-(i−1) sections 14. Patterns 17 to 20 are crossing the boundary of the level-i section 15. If the patterns 17 to 20 have each a size L smaller than a threshold "$k*L_{a,i}$" where $L_{a,i}$ is a section-to-section connection allowance set for the level-i sections 15 and k is a coefficient the pattern diagnosis unit 7 detects these patterns 17 to 20 as violation patterns. In FIG. 8B, the pattern shifter 8 shifts the violation patterns 17 to 20 out of the boundary of the level-i section 15. More precisely, the violation pattern 17 is shifted left by a level-(i−1) section 14 into the level-i section 15. The violation pattern 18 is shifted downward by a level-(i−1) section 14 out of the level-i section 15. The violation pattern 19 is shifted upward and right by a level-(i−1) section 14 into the level-i section 15. The violation pattern 20 is shifted upward by a level-(i−1) section 14 out of the level-i section 15.

The EB-data preparing method according to the first embodiment is expressible with a sequence of procedures. Accordingly, the EB-data preparing method can be described in a computer program that specifies processor functions executed by a computer. The computer program can be stored in a computer readable storage medium. The storage medium may be used as or written into the program storage 49 of FIG. 6, so that the process controller 1 may follow the program. The storage medium may be a semiconductor memory such as a ROM and RAM, a magnetic disk, an optical disk, or a magnetic tape, capable of storing computer programs.

Figure 9:
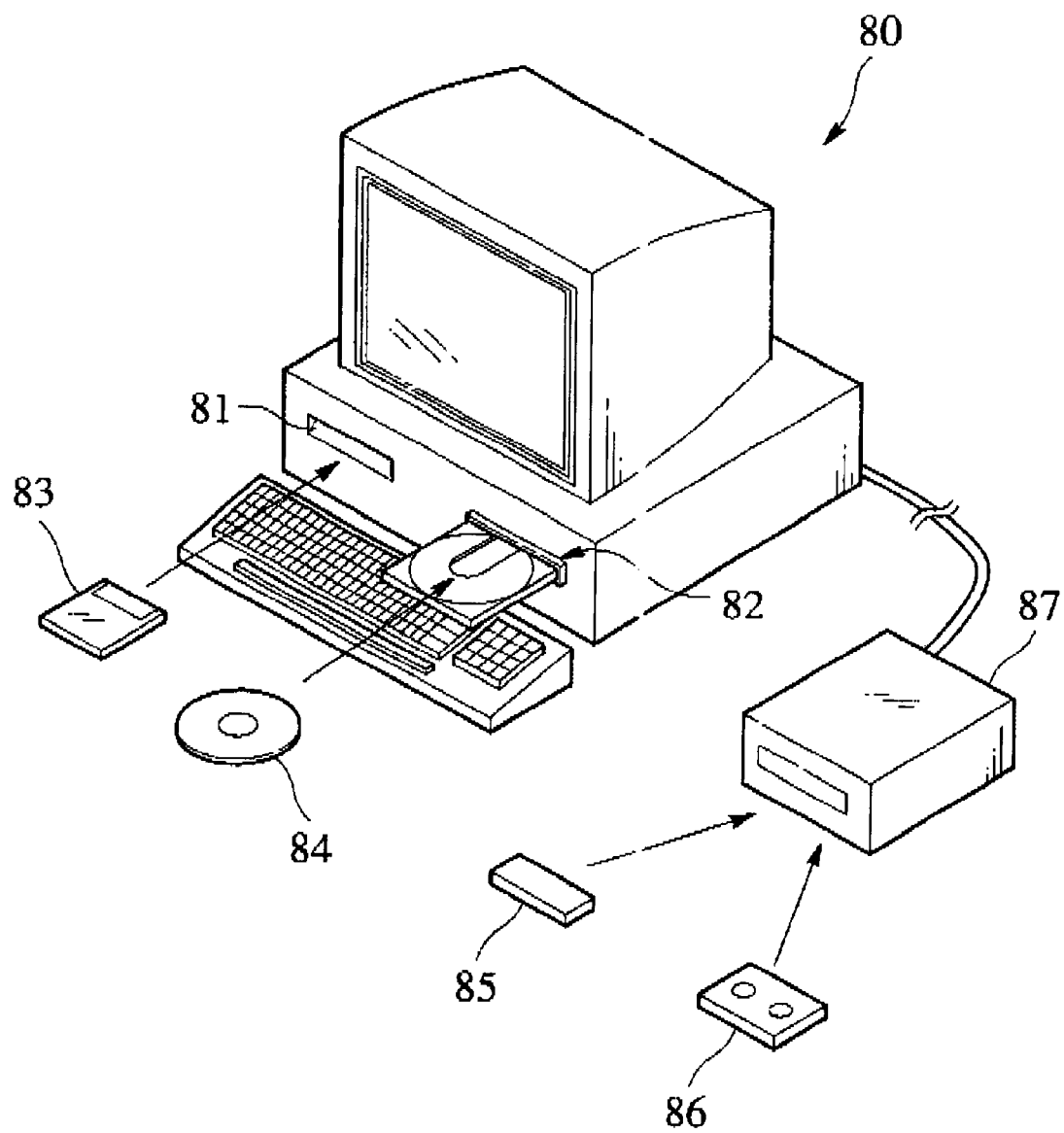
FIG. 9 is a perspective view showing a computer system serving as an EB-data preparing apparatus according to embodiments of the present invention.

FIG. 9 is a perspective view showing an EB-data preparing apparatus 80 for achieving the EB-data preparing method according to the embodiments of the present invention. The apparatus 80 is a computer system that reads a program from a storage medium and controls computer functions according to a sequence of procedures described in the program, to carry out the EB-data preparing method. The computer system 80 has a floppy disk drive 81 and a CD-ROM drive 82. A magnetic floppy disk 83 is inserted into the drive 81, and an optical CD-ROM 84 is inserted into the drive 82, so that computer programs are read out of the disks 83 and 84 and installed in the computer system 80. The computer system 80 may be connected to a drive 87 that handles a semiconductor ROM 85 used as, for example, a game pack, or a magnetic cassette tape 86.

In this way, the first embodiment shifts a fine pattern that may cause a characteristic deterioration due to a section-to-section connection error, so that the pattern may not cross a boundary between adjacent sections. This prevents the pattern from having an abnormal shape at the boundary and improves yield of electronic parts. The first embodiments leaves patterns as they are if they are large and causes no characteristic deterioration to improve efficiency of pattern date preparation.

Although the first embodiment has been explained in connection with patterns in a layout area of an electronic part or a semiconductor ship, this does not limit the embodiments of the present invention. The embodiments of the present invention is applicable to dividing a layout area of, for example, a printed wiring board where patterns of difference shapes are randomly arranged into sections and forming the patterns by section-by-section exposure.

Although the first embodiment has been explained in connection with electron beam exposure, this does not limit the embodiments of the present invention. The embodiments of the present invention is applicable to any pattern forming technique that divides a layout area of an electronic part where patterns are laid into sections and forms the patterns section by section.

Although the coefficient k of the threshold $L_{th}=k*L_a$ is a 5 in the first embodiment, this does not limit the embodiments of the present invention. The coefficient k serves as a reference to detect a fine pattern that may cause a characteristic deterioration in an electronic part due to a section-to-section connection error. Accordingly, the coefficient k may properly be set by an operator according to experiments like those shown in FIGS. 5A and 5B.

(Second Embodiments)

The first embodiment divides a layout area of an electronic part into a matrix of regular sections and rearranges patterns, so that they do not cross the boundaries of the sections and so that they cause no abnormality due to section-to-section connection errors. In a real electronic part such as an LSI, many patterns are densely and intricately formed in a layout area and involve complicated connections among the patterns. In this case, it is difficult to freely shift the patterns in the layout area. To cope with this problem the second embodiment properly redefines sections in a layout area instead of shifting patterns in the layout area.

Figure 10:
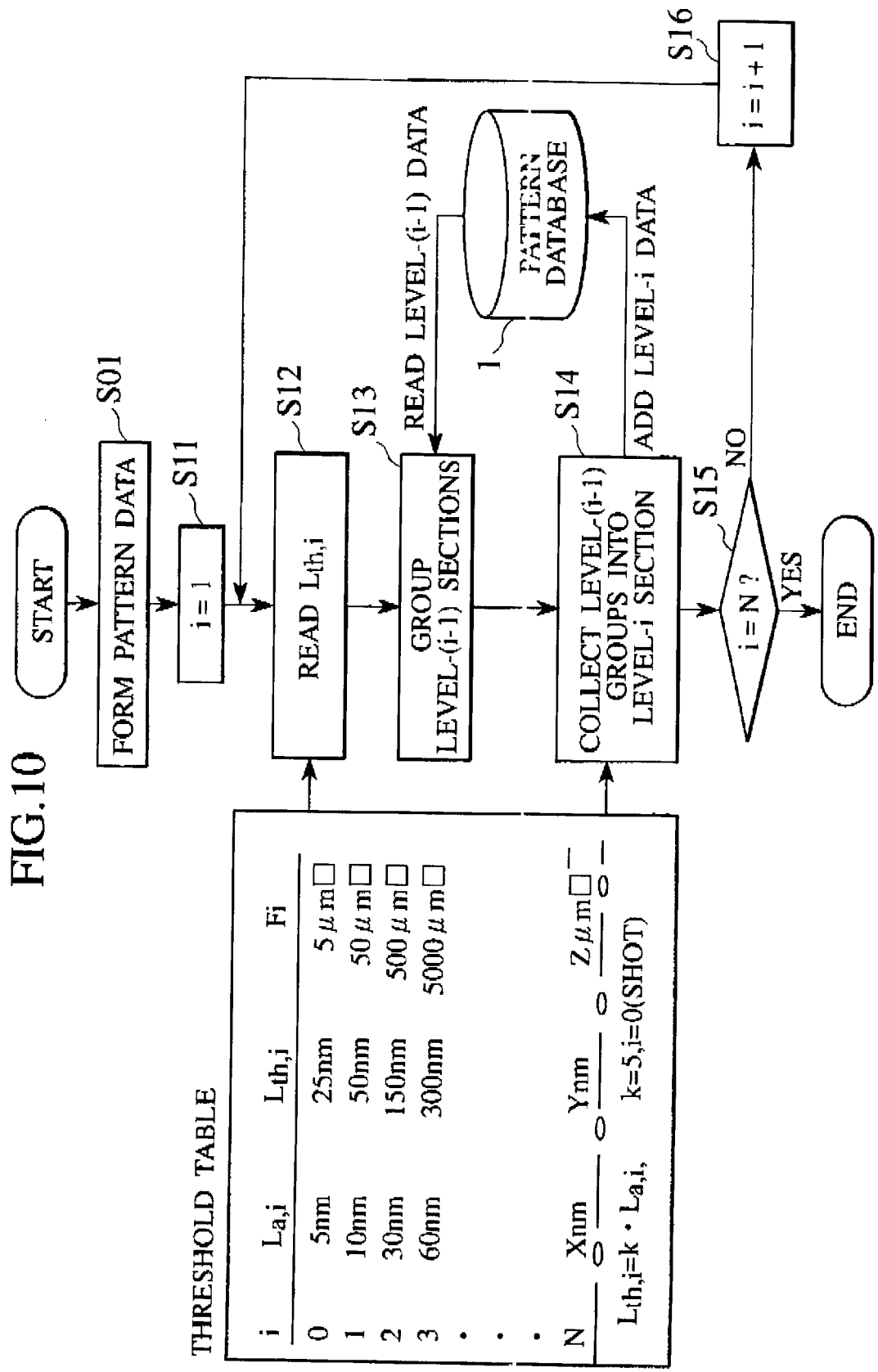
FIG. 10 is a flowchart showing an EB-data preparing method according to a second embodiment of the present invention.

FIG. 10 is a flowchart showing an EB-data preparing method according to the second embodiment of the present invention executed by the apparatus of FIG. 6.

(1) The pattern generator 47 (FIG. 6) forms patterns in a layout area of an electronic part according to circuit data of the electronic part. The patterns are saved as pattern data in the pattern database 1.

(2) Step S11 sets an initial value of 1 to specify level-i sections in the layout area. Section levels used by the second embodiment are the same as those of FIGS. 8A and 8B.

(3) Step S12 read a threshold table from the boundary database 2 (FIG. 6). The threshold table contains, for each of level-i (i ranging from 0 to N) sections, a section-to-section connection allowance $L_{a,i}$ a threshold $L_{th,i}$, and a maximum area Fi. The threshold $L_{th,i}$ is equal to $k*L_{a,i}$ where k=5 like the first embodiment. The maximum area Fi is a maximum area where both accuracy of positioning and uniformity of electron beam intensity are guaranteed. The maximum area Fi may optionally be set. According to the second embodiment, a level-i section is set to be smaller than the maximum area Fi.

(b 4) Step S13 reads data related to level-(i−1)sections from the pattern database 1 and forms level-(i−1)-section groups each containing level-(i−1) sections whose boundaries are crossed by a patterns having a size L smaller than the threshold Lth,i. This grouping operation is carried out on every pattern.

(5) Step S14 redefines the level-i sections each within the maximum area Fi so that no level-(i−1)-section group may cross the boundaries of the level-i sections. Data related to the redefined level-i sections is stored in the pattern database 1.

(6) Step S15 checks to see if i=N. If i=N ("YES" in step S15), the EB-data forming process ends, and if i is not N ("NO" in step S15), step S16 is carried out.

(7) Step S16 adds 1 to i to update i. Then, step S12 is repeated. Namely, the first loop sets i=1 in step S11 to redefine the level-1 sections in step S14. The second loop sets i=2 in step S16 and redefines the level-2 sections in step S14. The last loop sets i=N and redefines the level-N sections in step S14.

Figure 11:
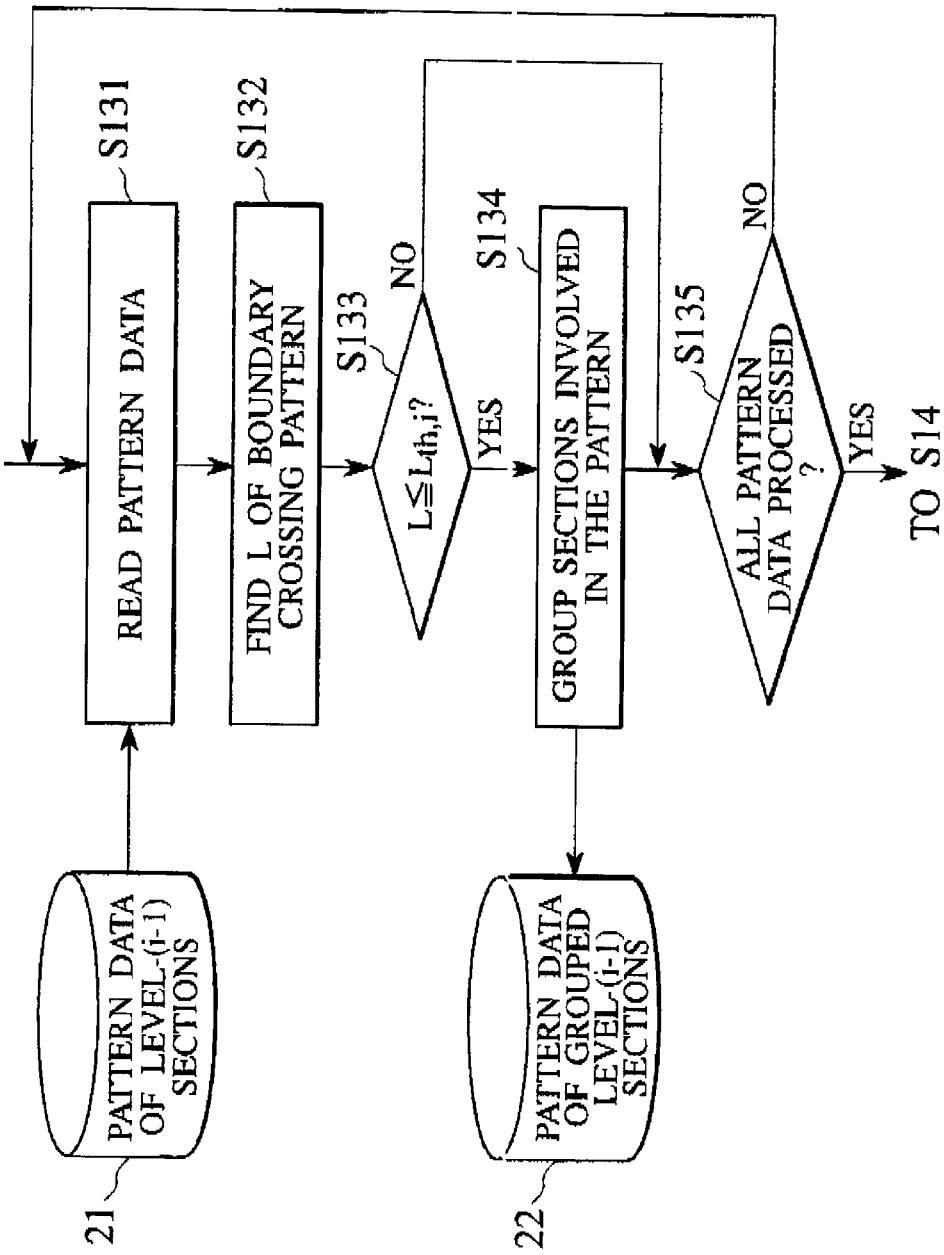
FIG. 11 is a flowchart showing the details of step S13 of FIG. 10.

FIG. 11 shows the details of step S13 of FIG. 10.

(I) After step S12, step S131 reads EB-data 21 which is divided by level-(i−1) sections into the process controller 3 (FIG. 6). The pattern data 21 includes patterns and level-(i−1) sections with boundaries.

(II) Step S132 find a size L of a pattern that crosses a boundary between adjacent level-(i−1) sections.

(III) Step S133 reads a level-i threshold Lth,i from the threshold table shown in FIG. 10 and checks to see if the size L is equal to or smaller than Lth,i. If L<=Lth,i ("YES" in step S133), step S134 is carried out, and if L>Lth,i ("NO" in step S133), step S135 is carried out.

(IV) Step S134 groups all level-(i−1) sections crossed by the pattern into one. Level-(i−1) EB-data 22 including such groups is stored in the pattern database 1.

(V) Step S135 checks to see if steps S131 to S134 have been carried out on every pattern contained in the level-(i−1) sections. If step S135 is "YES," step S14 of FIG. 10 is carried out. If step S135 is "NO," steps S131 to S134 are repeated.

Figure 12:
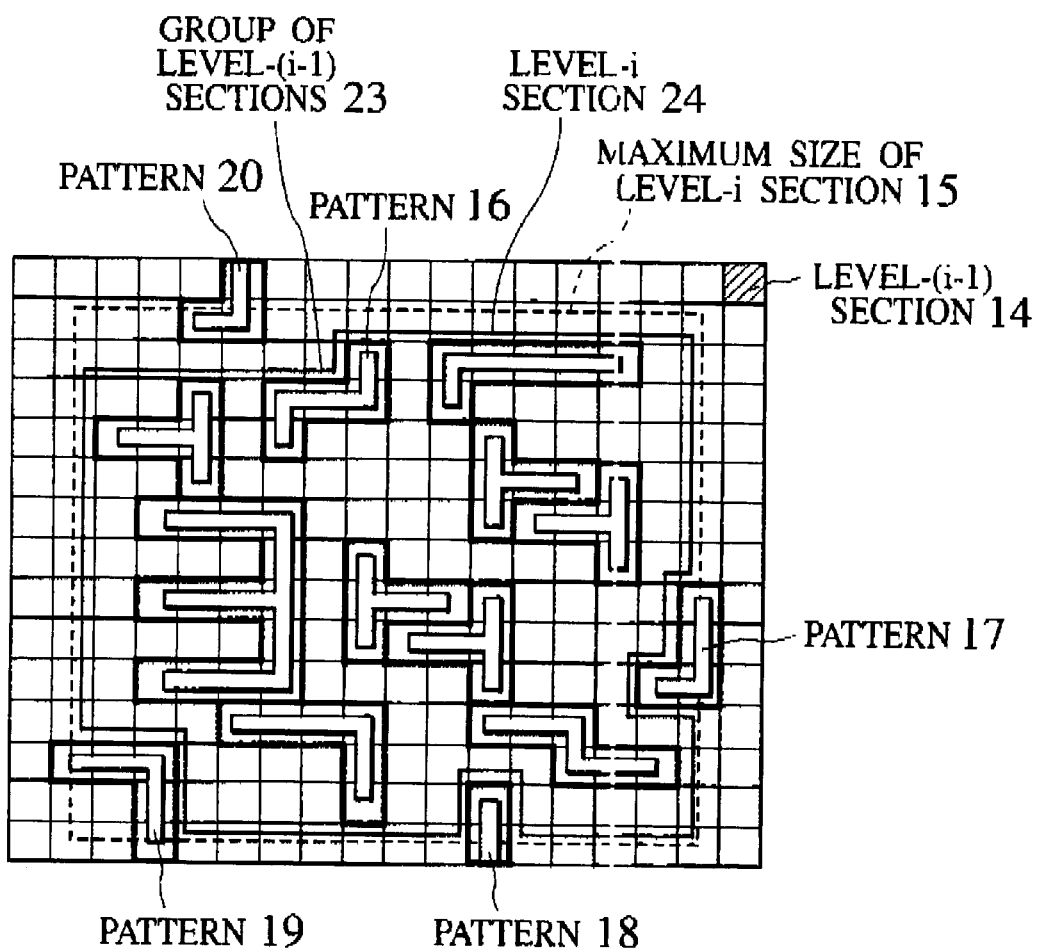
FIG. 12 corresponds to FIG. 8A and shows a level-i section defined according to the method of FIGS. 10 and 11.

FIG. 12 shows the same patterns as those shown in FIG. 8A. In FIG. 12, the level-(i−1) sections 14 are arranged in a matrix, and the sections 14 involve a plurality of patterns. All level-(i−1) sections 14 crossed by a pattern 16 from a level-(i−1) section group 23 surrounded with a thick line. A maximum area (Fi) 15 is surrounded with a dotted line. All level-(i−1)-sections groups 23 contained in the maximum area 15 are collected to form a level-i section 24. More precisely, patterns 17 to 20 cross the boundary of the maximum are (Fi) 15. Other patterns are contained within the maximum area 15. An area, that contains all patterns except the patterns 17 to 20 and is within the maximum area 15, is defined as the level-i section 24. The patterns 17 to 20 that are excluded from the level-i sections 24 are included in other level-i sections adjacent to the level-i section 24.

In this way, the second embodiment properly define sections in a layout area of an electronic part, to prevent abnormal patterns due to section-to-section connection errors, and improve yield of electronic parts without shifting patterns in layout areas.

Although the second embodiment has been explained in connection with patterns in a layout area of an electronic part or a semiconductor chip, this does not limit the embodiments of the present invention. The embodiments of the present invention is applicable to dividing a layout area of an object where patterns are formed into sections, and forming the patterns by section-by-section exposure.

Although the second embodiment has been explained in connection with electron beam exposure, this does not limit the embodiments of the present invention. The embodiments of the present invention is applicable to any pattern, forming technique that divides a layout area of an electronic part where patterns are laid into sections, and forming the patterns section by section.

Although the coefficient k of the threshold Lth,i=k*La,i is 5 in the second embodiment, this does not limit the embodiments of the present invention. The coefficient k serves as a reference to detect a fine pattern that may cause a characteristic deterioration in an electronic part due to a section-to-section connection error. Accordingly, the coefficient k may properly be set by an operator according to experiments like those shown in FIGS. 5A and 5B.

(First Modification)

How to handle a pattern that crosses a level-i-section boundary according to the first modification of the second embodiment of the present invention will be explained. This modification is to handle, for example, the patterns 17 to 20 of FIG. 12 excluded from the level-i section 24.

Figure 13A:
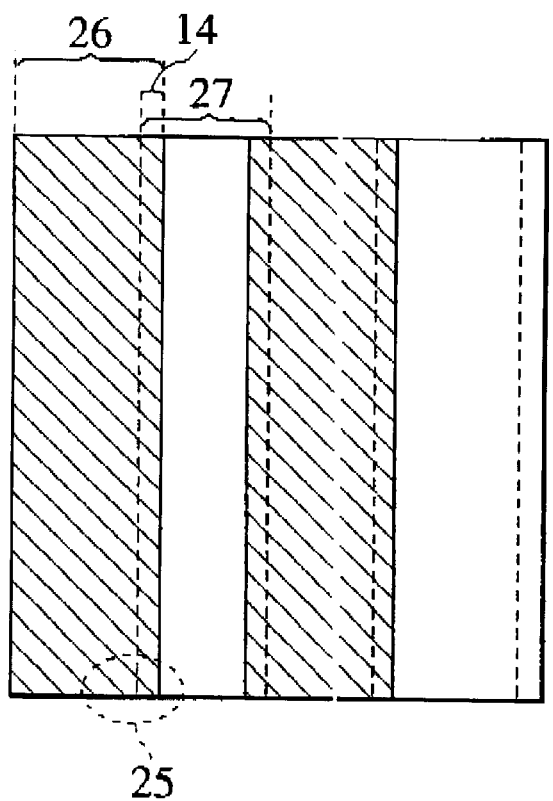
FIGS. 13A and 13B show overlapping level-i sections whose boundaries are defined according to a first modification of the second embodiment.

FIG. 13A shows two maximum level-i sections 26 and 27 partly overlapping each other. The width of the overlapping part corresponds to the width of a level-(i−1) section 14.

Figure 13B:
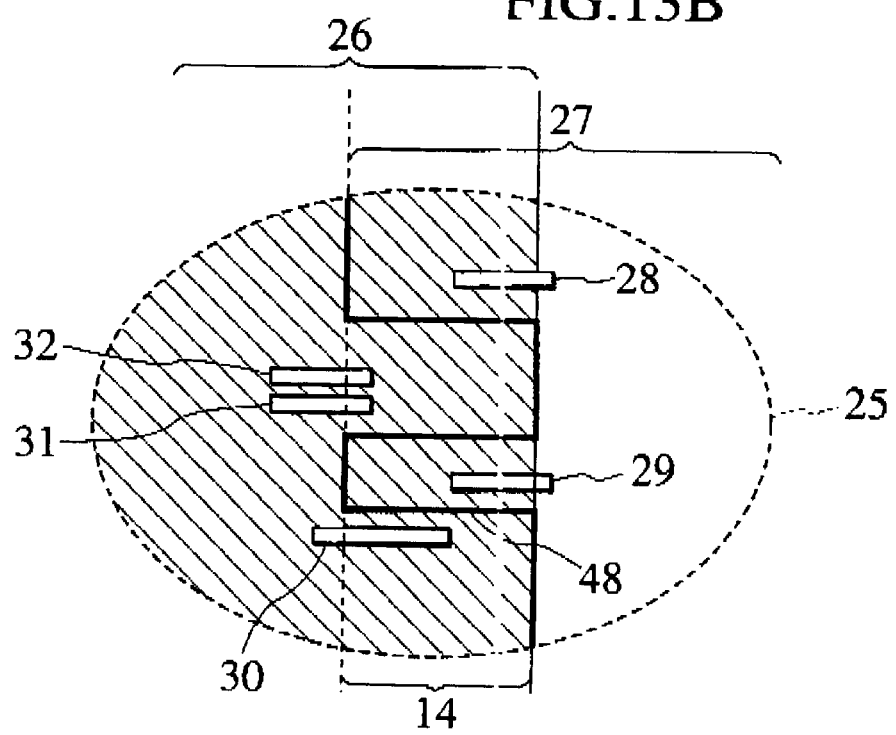

FIG. 13B shows patterns 28 to 32 that are arranged in level-(i−1) sections in the overlapping part of the level-i section 26 to 27. Each of the patterns 28 to 32 has a size L smaller than a threshold k*La,i set for level-i sections. Accordingly, the patterns 28 to 32 must not cross the boundaries of the level-i sections. To solve this problem, a boundary 48 between the level-i sections 26 to 27 is redefined within the region of the level-(i−1) section 14 so that each of the patterns 28 to 32 is contained in one of the level-i sections 26 to 27, as shown in FIG. 13B. More precisely, the patterns 28 to 29 at the periphery of the level-i section 26 are contained in the level-i section 27, and the patterns 30 to 32 at the periphery of the level-i section 27 are contained in the level-i section 26.

FIG. 14 shows a matrix of level-(i−1) sections 14. A maximum level-i section 15 contains a plurality of level-(i−1) sections 14. Patterns arranged in the section 15 have different shapes and are randomly arranged. Each pattern 34 batched with solid lines has a size L greater than a level-i threshold Lth,i=k*La,i. Each pattern 33 without batching lines has a size L smaller than the level-i threshold Lth,i. Accordingly, the patterns 34 may cross level-i-section boundaries, and the patterns 33 must not cross level-i-section boundaries.

To solve this problem, the level-i section 15 and adjacent maximum level-i sections are arranged to overlap by the width of the level-(i−1) section 14, and the level-i sections are redefined so that the patterns 33, crossing level-i-section boundaries, are contained in the adjacent level-i sections or in a level-i section 24 batched with dotted lines redefined from the level-i section 15.

In this way, the first modification optionally defines the boundary of each level-i section within an area where the level-i section overlaps an adjacent level-i section. The first modification is capable of preventing abnormal patterns and improving yield of electronic parts without shifting patterns in layout area.

(Second Modification)

The second modification of the second embodiment of the present invention, expresses each boundary stored in the boundary database 2 (FIG. 6) with a boundary pattern, overlays such boundary patterns on a layout area of an electronic part or a semiconductor chip, and detects every pattern that is on a boundary pattern with use of a standard pattern rule checker.

Figure 15A:
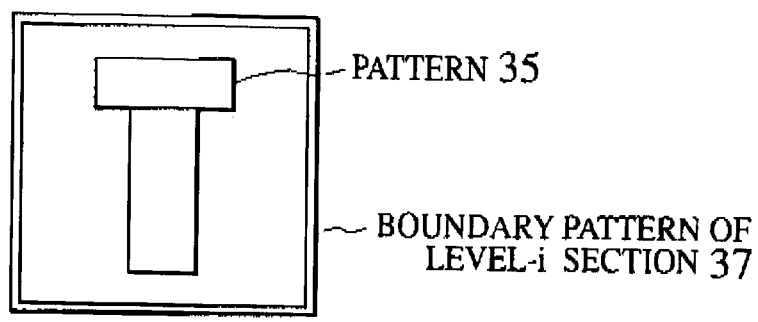
FIGS. 15A to 15C show patterns and sections handled by a second modification of the second embodiment.

FIG. 15A shows a boundary pattern 37 having a finite width along a level-i-section boundary. A pattern 35 has a size L smaller than a threshold Lth,i, and therefore, must not be on the level-i boundary pattern 37. The pattern 35 in FIG. 15A is not on the level-i boundary pattern 37. Accordingly, a known pattern rule checker that checks overlapping patterns will not detect the pattern 35 as a violent pattern.

Figure 15B:
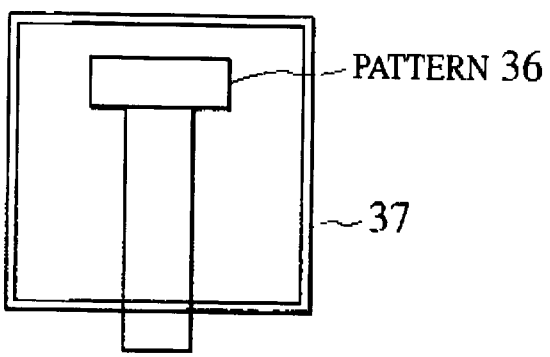

FIG 15B shows a pattern 36 and a level-i-section boundary pattern 37. The pattern 36 has a size L smaller than the threshold Lth,i, and therefore, must not be on the boundary pattern 37. In FIG. 15B, the pattern 36 is on the boundary pattern 37, and therefore a known pattern rule checker may detect the pattern 36 as a violent pattern.

Figure 15C:
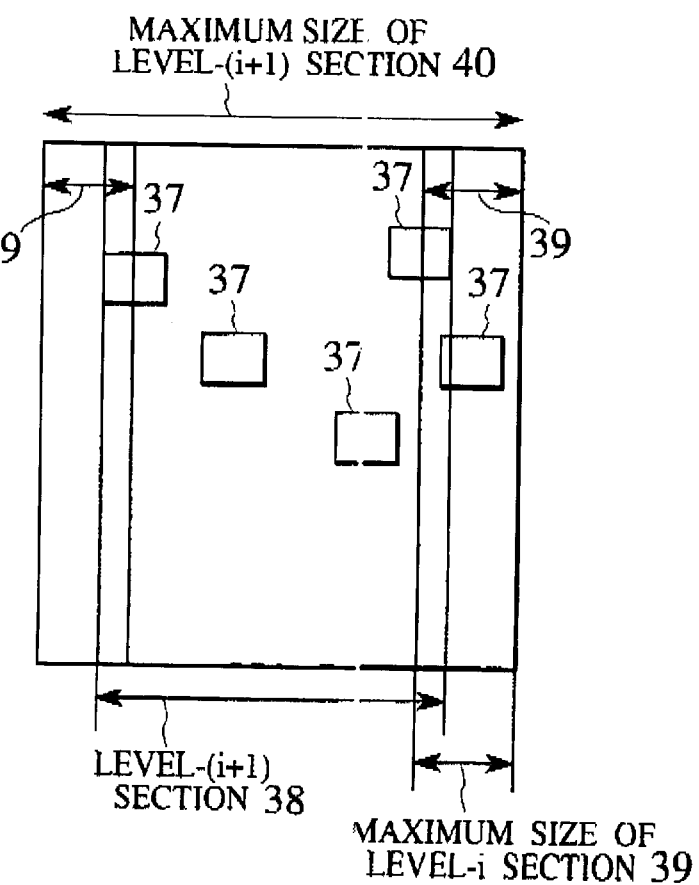

A threshold Lth,(i+1) for level-(i+1) sections is greater than the threshold Lth,i, and therefore, the patterns 35 and 36 of FIGS. 15A and 15B must not cross level-(i+1) boundaries. In FIG. 15C, a level-(i+1) section 38 is defined by subtracting a maximum level-i section size 39 from each end of a maximum level-(i+1) section size 40, and each level-i section 37 is arranged at an optional location in the level-i (i+1) section 38. If there is level-i section 37 that is not contained in the level-(i+1) section 38, a new level-(i+1) section is formed adjacent to the section 38 and such a level-i section 37 is contained in the new level-(i+1) section. As a result, the patterns 35 of 36 will not cross the boundaries of the level-i sections 37 and level-(i+1) sections 38.

Figure 16A:
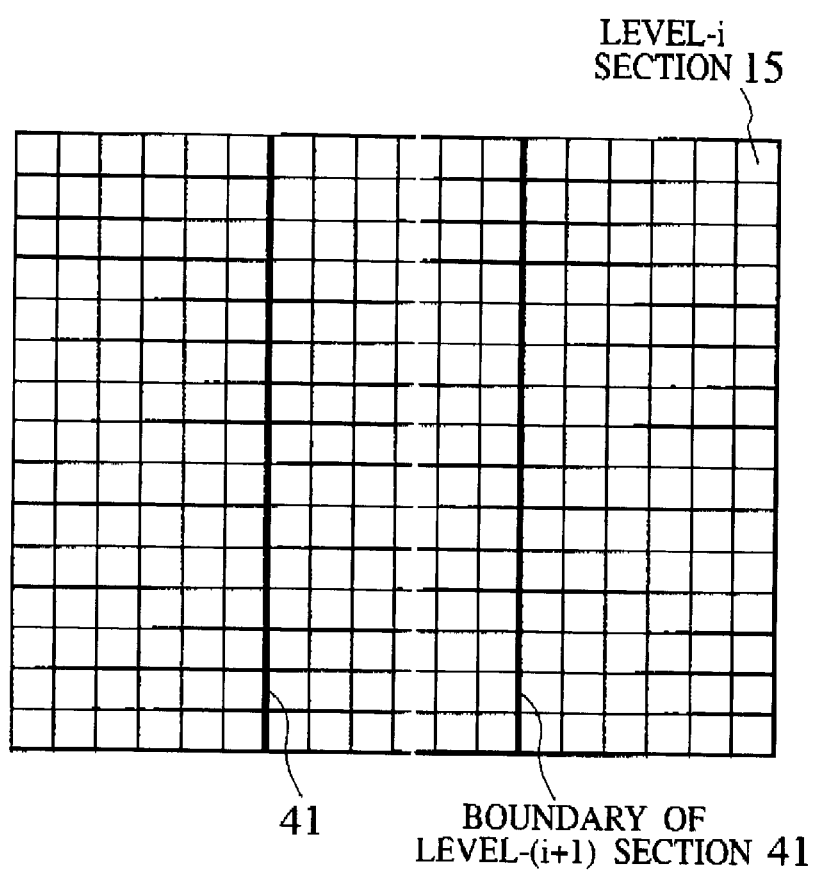
FIGS. 16A to 16C show other examples of sections and patterns handled by the second modification of the second embodiment.
Figure 16B:
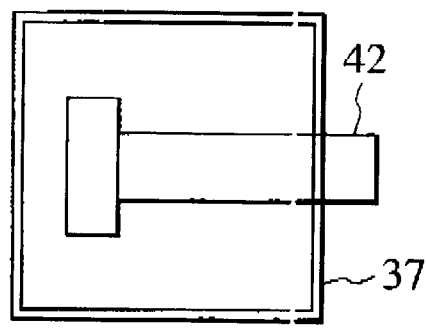

A technique of avoiding abnormal patterns due to connection errors when the boundaries of level-i sections and level-i+1) sections are fixed will be explained. FIG. 16A shows level-i sections 15 and boundaries 41 of level-(i+1) sections formed at proper intervals. FIG. 16B shows a pattern 42 crossing a boundary pattern 37. The pattern 42 is usually detected as a violation pattern. If the pattern 42 has a size L larger than a level-i section threshold Lth,i, the pattern 42 is allowed to cross the boundary pattern 37.

Figure 16C:
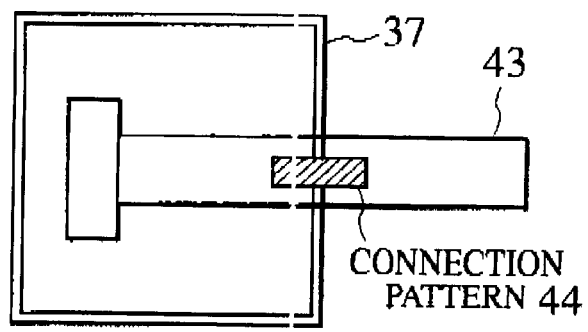

FIG. 16C shows a connection pattern 44 added by MDP to the crossing of a pattern 43 and a boundary pattern 37. The connection pattern 44 prevents thinning or opening of the pattern 43 at the crossing or the boundary. In this case, the process controller 3 (FIG. 6) further has a connection data adder for adding connection data to the crossing of a violation pattern detected by the pattern diagnosis unit 7 and a boundary crossed by the violation pattern.

In the way, the second modification provides each boundary with a finite width to form a boundary pattern and overlays the boundary patterns on patterns in a layout area of an electronic part, so that a known pattern rule checker may easily detect patterns that interfere with the boundary patterns. If the boundaries of sections are fixed, the second modification adds a connection to a location where a pattern opening or thinning may occur.

Additional advantages and modifications of the present invention will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for preparing EB-data used for a process that divides a layout area of an electronic part into sections and draws patterns in the layout area section by section, comprising:

a pattern generator which forms and lays the patterns in the layout area according to circuit data of the electronic part, the layout area being divided into the sections; and a pattern diagnosis unit which detects, among the patterns, a violation pattern that crosses a boundary between adjacent ones of the sections and has a size L smaller than a threshold "k*La" where the size L represents a width at the violation pattern, La is a section-to-section connection allowance and k is equal to or more than 5.

2. The apparatus of claim 1 further comprising:

a display which displays the violation pattern and the boundary crossed by the violation pattern.

3. The apparatus of claim 1 further comprising:

an adding unit which adds a connector to the violation pattern at the crossing of the violation pattern and the boundary.

4. The apparatus of claim 1 further comprising:

a pattern shifter which shifts the violation pattern into one of the adjacent sections.

5. A method of preparing pattern data used for a process that divides a layout area of an electronic part into sections and draws patterns in the layout area section by section, comprising:

forming and laying the patterns in the layout area according to circuit data of the electronic part, the layout area being divided into the sections; and detecting, among the patterns, a violation pattern that crosses a boundary between adjacent ones of the sections and has a size L smaller than a threshold "k*La" where the size L represents a width of the violation pattern, La is a section-to-section connection allowance and k is equal to or more than 5.

6. The method of claim 5 further comprising;

displaying the violation pattern and the boundary crossed by the violation pattern.

7. The method of claim 5 further comprising;

adding a connector to the violation pattern at the crossing of the violation pattern and the boundary.

8. The method of claim 5 further comprising;

shifting the violation pattern into one of the adjacent sections.

9. The method of claim 5, wherein detecting a violation pattern comprises;

providing each boundary of the sections with a finite width;

overlaying a width-provided boundaries on the patterns; and detecting a violation pattern that crosses one of the width-provided boundaries.

10. The method of claim 5, wherein the pattern data is used for a section-by-section exposure process that divides a layout area of an electronic part into sections and draws patterns in th layout area by section-by-section exposure.

11. A computer program for preparing pattern data used for a process that divides a layout area of an electronic part into sections and draws patterns in the layout area section by section, wherein the computer program executes:

forming and laying the patterns in the layout area according to circuit data of the electronic part, the layout area being divided into the sections; and detecting, among the patterns, a violation pattern that crosses a boundary between adjacent ones of the sections and has a size L smaller than a threshold "k*La" where the size L represents a width of the violation pattern, La is a section-to-section connection allowance and k is equal to or more than 5.

12. The computer program of claim 11, wherein the computer program further executes:

displaying the violation pattern and the boundary crossed by the violation pattern.

13. The computer program of claim 11, wherein the computer program further executes:

adding a connector to the violation pattern at the crossing of the violation pattern and the boundary.

14. The computer program of claim 11, wherein the computer program further executes:

shifting the violation pattern into one of the adjacent sections.

15. The computer program of claim 11, wherein detecting a violation pattern comprises:

providing each boundary of the sections with a finite width;

overlaying the width-provided boundaries on the patterns; and detecting a violation pattern that crosses one of the width-provided boundaries.

16. A method of preparing pattern data used for a process that divides a layout area of an electronic part into hierarchical sections of different sizes ranging from smallest level-0 sections to largest level-N sections, the level-0 sections serving as unit sections and draws patterns in the layout area section by section, comprising:

forming and laying the patterns in the layout area according to circuit data of the electronic part;

for each i (i being sequentially changed from 1 to N), forming level-(i−1)-section groups each containing level-(i−1) sections whose boundaries are crossed by one of the patterns having a size L smaller than a threshold "k*La,i" where La,i is a section-to-section connection allowance for level-i sections and k is a coefficient; and redefining the level-i sections each within a maximum level-i section area so that no level-(i−1)-section group may cross the boundaries of the level-i sections.

17. The method of claim 16, wherein forming level-(i−1)-section groups comprises:

finding the threshold $L_{th,i} \times k*L_{a,i}$;

finding a size L of a pattern crossing a boundary between level-of(i−1) sections;

determining whether or not the size L is smaller than the threshold $L_{th,i}$; and if the size L is smaller than the threshold $L_{th,i}$, grouping all level-(i−1) sections whose boundaries are crossed by the pattern.

18. An electronic part having a layout area divided into sections, comprising:

patterns drawn in the layout area section by section, any one of the patterns that crosses a boundary between adjacent ones of the sections has a size L greater than a threshold "k*La" where La is a section-to-section connection allowance and k is equal to or more than 5, wherein the size L represents a width of the violation pattern.

19. The electronic part of claim 18, wherein the patterns are irregularly arranged and have different shapes.

20. A method of manufacturing an electronic part, comprising:

designing and laying patterns in a layout area of the electronic part;

dividing the layout area into sections;

detecting, among the patterns, a violation pattern that crosses a boundary between adjacent ones of the sections and has a size L smaller than a threshold "k*La" where La is a section-to-section connection allowance and k is equal to or more than 5;

shifting the violation pattern into one of the adjacent sections; and drawing the patterns, including the shifted violation pattern, in the layout area by section-by-section exposure, wherein the size L represents a width of the violation pattern.

* * * * *